United States Patent
Tamai

(10) Patent No.: US 10,431,754 B2
(45) Date of Patent: Oct. 1, 2019

(54) FLEXIBLE DISPLAY DEVICE

(71) Applicant: LG Display Co., Ltd., Seoul (KR)

(72) Inventor: Kazuhiko Tamai, Tokyo (JP)

(73) Assignee: LG Display Co., Ltd., Seoul (KR)

( * ) Notice: Subject to any disclaimer, the term of this patent is extended or adjusted under 35 U.S.C. 154(b) by 19 days.

(21) Appl. No.: 15/693,205

(22) Filed: Aug. 31, 2017

(65) Prior Publication Data

US 2018/0062093 A1    Mar. 1, 2018

(30) Foreign Application Priority Data

Aug. 31, 2016    (JP) ................... 2016-169106

(51) Int. Cl.
*H01L 51/00*    (2006.01)
*H01L 27/32*    (2006.01)
*H01L 51/52*    (2006.01)

(52) U.S. Cl.
CPC ...... *H01L 51/0097* (2013.01); *H01L 27/3262* (2013.01); *H01L 51/524* (2013.01); *H01L 2251/5338* (2013.01); *Y02E 10/549* (2013.01)

(58) Field of Classification Search
CPC ... H01L 51/00; H01L 51/524; H01L 51/0097; H01L 51/525; H01L 51/5287; H01L 51/107; H01L 51/448; H01L 51/5296; H01L 51/52; H01L 51/5256; H01L 2227/32

USPC .......................................................... 257/72
See application file for complete search history.

(56) References Cited

U.S. PATENT DOCUMENTS

| | | | | |
|---|---|---|---|---|
| 2012/0105940 A1* | 5/2012 | Hayashi | ............ | B29D 11/0073 359/296 |
| 2014/0203223 A1* | 7/2014 | Ikada | ................... | B32B 15/08 252/514 |

FOREIGN PATENT DOCUMENTS

| | | |
|---|---|---|
| JP | 2003-280546 A | 10/2003 |
| JP | 2006-039530 A | 2/2006 |
| JP | 2006-073636 A | 3/2006 |
| JP | 2011-085934 A | 4/2011 |
| JP | 2013-210491 A | 10/2013 |
| JP | 2014-016616 A | 1/2014 |
| JP | 2015-143846 A | 8/2015 |
| KR | 10-2014-0056551 A | 5/2014 |

\* cited by examiner

*Primary Examiner* — Chuong A Luu
(74) *Attorney, Agent, or Firm* — Seed IP Law Group LLP

(57) ABSTRACT

Disclosed is a flexible display device that includes a display element that is flexible; and a member that is located on a surface of the display element and is made of a material having a 3-dimensional cross-linked structure. The display element has an original shape and has an elastic modulus that enables the display element to flex into a modified shape. The member has a rigidity that urges the display element from the modified state back to the original shape.

20 Claims, 5 Drawing Sheets

FLEXIBLE DISPLAY DEVICE

CROSS-REFERENCE TO RELATED APPLICATIONS

This application claims the priority benefit of Japanese Patent Application No. 2016-169106 filed in Japan on Aug. 31, 2016, which is hereby incorporated by reference in its entirety for all purposes as if fully set forth herein.

BACKGROUND

Technical Field

The present disclosure relates to a flexible display device.

Description of the Related Art

Recently, flexible display devices have been proposed. A substrate for the flexible display device uses, for example, PET (Polyethylene terephthalate), PEN (Polyethylene naphthalate, PI (Polyimide) or the like.

However, flexible display devices in the prior art have a problem of not returning to their original shape after having been kept in a modified state for a period of time or after having the shape of the flexible display device repeatedly modified. In this manner, the modified shape of the device has a tendency to become set (i.e., the device does not return to its original shape, which is a totally flat state).

BRIEF SUMMARY

Accordingly, the present disclosure is directed to a flexible display device that returns to its original shape (i.e., sufficiently returns to a flat state) even after keeping the flexible display device in a modified state for a period of time or after having the shape of the flexible display device repeatedly modified.

Additional features of the disclosure will be set forth in the description which follows, and in part will be apparent from the description In accordance with the present disclosure, as embodied and broadly described herein, a flexible display device includes a display element that is flexible; and a member that is located on a surface of the display element and is made of a material having a 3-dimensional cross-linked structure.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION

Reference will now be made in detail to embodiments, examples of which are illustrated in the accompanying drawings. The same or like reference numbers may be used throughout the drawings to refer to the same or like parts.

Figure 1:
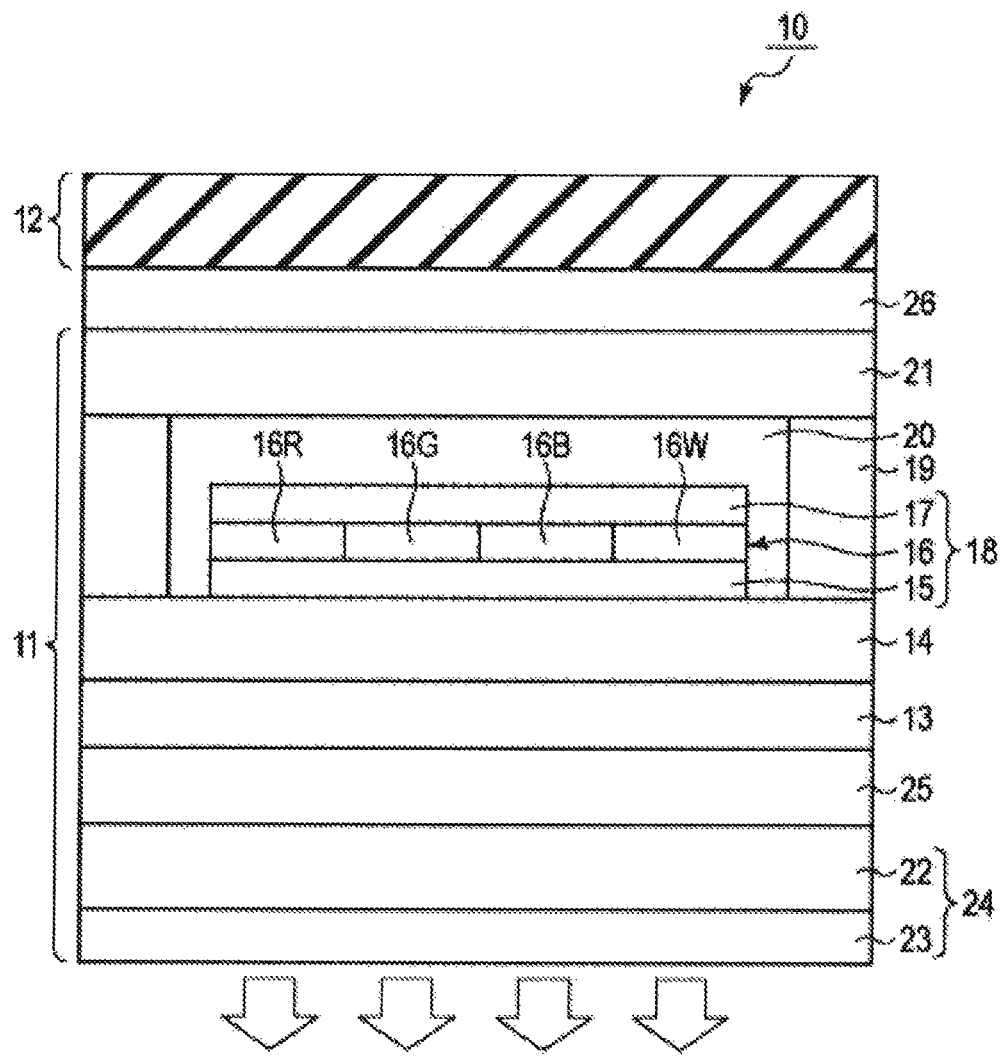
FIG. 1 is a cross-sectional view illustrating a flexible display device according to an embodiment of the present disclosure.

An embodiment of the present disclosure is explained with reference to FIGS. 1 to 4(b). FIG. 1 is a cross-sectional view illustrating a flexible display device according to an embodiment of the present disclosure.

Referring to FIG. 1, the flexible display device 10 of the embodiment includes a flexible display element 11, and a member 12 located on a surface (e.g., a top surface or upper surface) of the display element 11. The member 12 serves to urge the modified flexible display device 10 to return to an original state. The display element 11 and the member 12 are each formed in a plate shape. The display element 11 and the member 12 may each have a shape, for example, a rectangular shape. The display element 11 and the member 12 are arranged in parallel with each other. A shape of the display element 11 and the member 12 is not limited to the rectangular shape, and may be a circular shape, or polygonal shape.

The display element 11 includes a substrate 13. A multi-layered barrier film 14 is located on a surface (e.g., a top surface or upper surface in FIG. 1) of the substrate 13. A thin film transistor (TFT) layer 15 including an TFT is located on the barrier film 14. A color filter layer 16 is located on the TFT layer 15. An organic light emitting diode (OLED) layer 17 including an OLED is located on the color filter layer 16. As such, a structure portion 18 including the TFT layer 15, the color filter layer 16 and the OLED layer 17 is formed on the substrate 13 having the barrier film 14. In this embodiment, a case that uses a combination of a color filter layer 16, which includes a red color filter 16R, a green color filter 16G, a blue color filter 16B and a white color filter 16W, and an OLED layer emitting a white is described by way of example, but not limited. Alternatively, an OLED layer emitting each of red, green and blue, instead of the OLED layer 17 emitting white, may be used, and in this case, a color filter layer is not needed.

A material of the substrate 13 may use, for example, a resin. For example, as this resin, PI (Polyimide) may be used. The material of the substrate 13 is not limited to PI, and may use a resin that has a heat resistance over temperatures to form the barrier film 14 and the TFT layer 15. The substrate 13 has a thickness, for example, about 13 um.

The multi-layered barrier film 14 has a structure that a plurality of barrier layers, which have a barrier property to oxygen and vapor, are layered. For the barrier layers, for example, metal, inorganic compound, polymer and so on may be used.

The TFT layer 15 includes a TFT that controls a supply of voltage to the OLED layer 17. The TFT may be a p (positive) type or n (negative) type TFT. The TFT may have a known configuration including a semiconductor layer and electrodes. The semiconductor layer may use, for example, amorphous silicon, poly silicon or the like. The TFT is applied with a predetermined voltage from a control device (not shown) through an electrode, and supplies a voltage to the OLED layer 17. A number and an arrangement of TFTs included in the TFT layer 15 are appropriately configured according to a configuration of the flexible display device 10. In a case that the flexible display device 10 is a bottom emission type, electrodes included in the TFT layer 15 may be made of a light-transmissive conductive material. This material may be, for example, ITO (Indium Tin Oxide) or the like. The TFT layer 15 may have a thickness, for example, about 4.5 um.

The color filter layer 16 includes the red color filter 16R, the green color filter 16G, the blue color filter 16B and the white color filter 16W.

The OLED layer 17 includes an OLED (i.e., organic EL (electroluminescent) element) that emits light according to a voltage supplied from the TFT layer 15. The OLED has a known configuration including an organic light emitting layer and electrodes. The organic light emitting layer may use, for example, a pigment based material, metal complex based material, polymer bases material, and so on. The OLED layer 17 emit, for example, white. A number and an arrangement of OLEDs included in the TFT layer 15 are appropriately configured according to a configuration of the flexible display device 10. The electrodes included in the OLED layer 17 may be made of a light-transmissive conductive material. This material may be, for example, ITO (Indium Tin Oxide) or the like. The OLED layer 17 may have a thickness, for example, about 0.6 um.

A sealing portion 19 is formed on the multi-layered barrier film 14. The sealing portion 19 is formed on peripheral portions of the barrier film 14 while surrounding the structure portion 18 including the color filter layer 16 and the OLED layer 17. The structure portion 18 surrounded by the sealing portion 19 is encapsulated by an encapsulation layer 20. The encapsulation layer 20 is made of a material that has a barrier property to oxygen and vapor. This material may be, for example, a metal, inorganic compound, polymer or so on. A bottom surface (or a lower surface) of the structure portion 18 is covered by the barrier film 14, and a top surface and a side surface of the structure portion 18 are covered by the encapsulation layer 20. Due to this configuration, the oxygen and vapor may be prevented from reaching the TFT layer 15 and the OLED layer 17 in the structure portion 18.

A metal layer 21 is located on the substrate 13 having the encapsulation layer 20 and the sealing portion 19. The metal layer 21 may have a thickness, for example, about 50 um.

A laminated portion 24 is formed on an opposite surface (e.g., a bottom surface or lower surface in FIG. 1) of the substrate 13, and includes a front film 22 and a hard coating film 23. The laminated portion 24 may be attached to the bottom surface of the substrate 13 using, for example, an adhesive layer 25 made of PSA (Pressure-Sensitive Adhesive). The front film 22 may have a thickness, for example, about 50 um. The hard coating film 23 may have a thickness, for example, about 10 um or less. The adhesive layer 25 may have a thickness, for example, about 25 um. The display element 11 is configured as above.

The member 12 may be made of a material having a 3-dimensional cross-linked structure i.e., a material including a 3-dimensional cross-linked polymer. After keeping the flexible display device 10 in a modified state for a period of time or after having the shape of the flexible display device repeatedly modified, the member 12 applies a restoring force to return the flexible display device back to its original shape from a modified shape. Further, by using the 3-dimensional cross-linked structure material for the member 12, a neutral surface (or neutral plane) (31 of FIGS. 2(a) to 3(c)) is located at a position sufficiently away from the member 12, thus a shape of the display element 11 can be returned to an original state. A glass transition temperature (Tg) of the material used for the member 12 is preferably less than a lowest limit of a preservation temperature range of the flexible display device 10. In the present disclosure, the preservation temperature range of the flexible display device 10 is a temperature range that is permissible to preserve the flexible display device 10. In an embodiment in which the preservation temperature range is −20 degrees Celsius to 50 degrees Celsius, the glass transition temperature (Tg) of the member 12 is lower than −20 degrees Celsius. The material of the member 12 may be, for example, a silicon rubber. The glass transition temperature (Tg) of the silicon rubber is around −125 degrees Celsius, which is much lower than the lowest limit of the preservation temperature range of the flexible display device 10. Since the glass transition temperature (Tg) of the member 12 is lower than the lowest limit of the preservation temperature range of the flexible display device 10, even when keeping the flexible display device 10 in a modified state at a lower temperature, it is possible that the flexible display device 10 is returned to a non-modified state, i.e., an original state. A thickness of the member 12 may be, for example, about 1 mm. The member 12 is attached to the display element 11 using an adhesive layer 26 made of PSA (Pressure-Sensitive Adhesive). The adhesive layer 26 is located entirely on the surface (the top surface in FIG. 1) of the display element 11. The material of the member 12 is not limited to a silicon rubber and may appropriately be a material that has a glass transition temperature (Tg) lower than the lowest limit of the preservation temperature range of the flexible display device 10. For example, an urethane rubber may be used for the member 12.

The flexible display device 10 is configured as above.

Figure 2A:
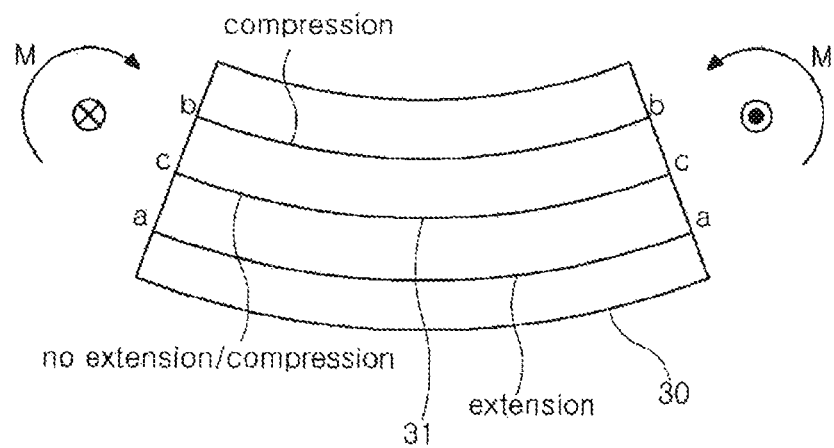
FIGS. 2(a) and 2(b) are views illustrating a neutral surface.

FIG. 2(a) is a view illustrating a neutral surface. When modifying (bending, flexing, curving, etc.) an object, an extension is produced at one side (i.e., an outside) (referring to 'a-a' in FIG. 2(a)) while a compression is produced at an opposite side (i.e., an inside) (referring to 'b-b' in FIG. 2(a)). Between a portion where the extension is produced and a portion where the compression is produced, a portion where neither the extension nor the compression is produced (referring to 'c-c' in FIG. 2(a)). At this portion, a distortion is zero even when modifying the object 30. A surface (or plane), where a distortion is zero when modifying the object 30, is referred to as a neutral surface (or neutral plane).

As a distance c between a position of the member 12 and the neutral surface 31 becomes longer, a moment of a force to return the flexible display device 10 to an original state becomes greater. Thus, in this embodiment, the neutral surface 31 of the flexible display device 10 is located outside the member 12.

When bending, flexing, or curving the flexible display device 10, if a distortion is produced at a TFT, a good displaying quality may be obtained. Thus, in this embodiment, the neutral surface 31 is located at the TFT layer 15 or near the TFT layer 15.

Since the neutral surface 31 is located at the TFT layer 15 or near the TFT layer 15, the modified flexible display device 10 can be effectively returned to an original state, and an occurrence of displaying defect can be prevented.

Figure 2B:
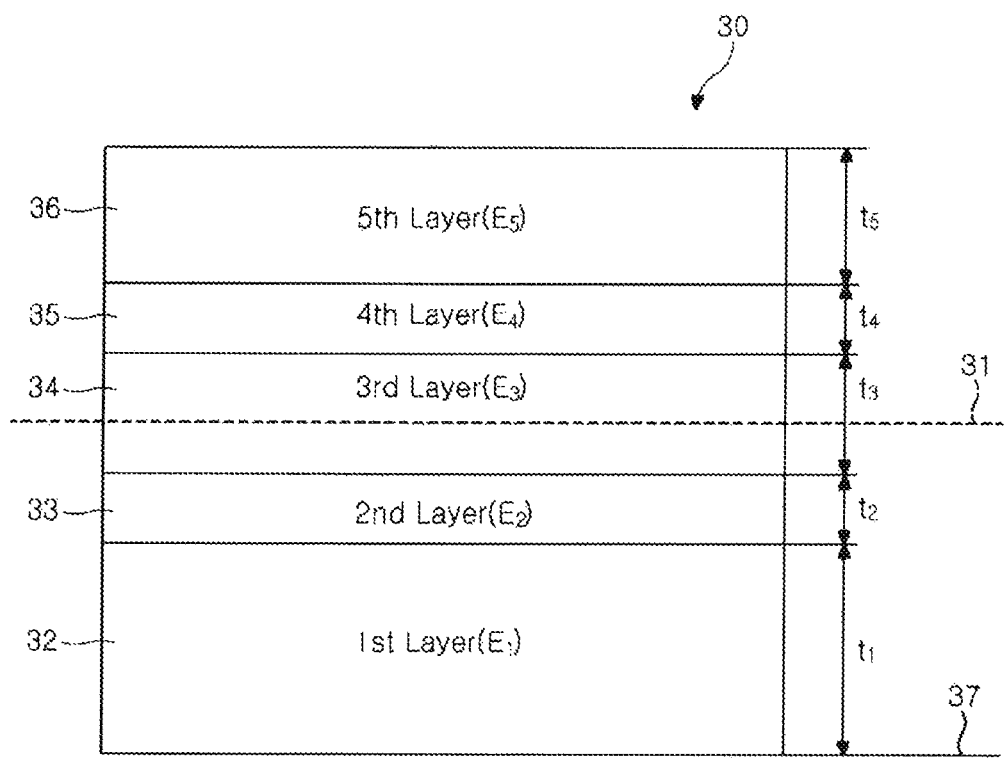

FIG. 2(b) is a view illustrating an example of a calculation model of a neutral surface 31. In FIG. 2(b), a calculation model of a neutral surface 31 for an object 30 (or structural body) having a 5-layered structure is shown. A position of the neutral surface 31 is calculated based on thicknesses and elastic moduli (e.g., Young's moduli) of respective components.

A thickness and an elastic modulus of a first layer 32 is t1 and E1, respectively. A thickness and an elastic modulus of a second layer 33 is t2 and E2, respectively. A thickness and an elastic modulus of a third layer 34 is t3 and E3, respectively. A thickness and an elastic modulus of a fourth layer 35 is t4 and E4, respectively. A thickness and an elastic modulus of a fifth layer 36 is t5 and E5, respectively. A bottom surface of the first layer 32 is a reference surface 37, and a distance c between the reference surface 37 and the neutral surface 31 is calculated by a following equation:

$$C=(E_1t_1d_1+E_2t_2d_2+E_3t_3d_3+E_4t_4d_4+E_5t_5d_5)/(E_1t_1+E_2t_2+E_3t_3+E_4t_4+E_5t_5).$$

In this equation, $d_1=t_1/2$, $d_2=t_1+t_2/2$, $d_3=t_1+t_2+t_3/2$, $d_4=t_1+t_2+t_3+t_4/2$, $d_5=t_1+t_2+t_3+t_4+t_5/2$.

When an elastic modulus (e.g., Young's modulus) is E and a second moment of area is I, a flexural rigidity EI is obtained by a following equation:

$$EI=\{[E_1(y_1^3-(-c)^3)]+[E_2(y_2^3-y_1^3)]+[E_3(y_3^3-y_2^3)]+[E_4(y_4^3-y_3^3)][E_5(y_5^3-y_4^3)]\}/3.$$

In this equation, $t_1-c$, $y_2=t_1+t_2-c$, $y_3=y_1+y_2+y_3-c$, $y_4=y_1+y_2+y_3+y_4-c$, $y_5=y_1+y_2+y_3+y_4+y_5-c$.

Figure 3A:
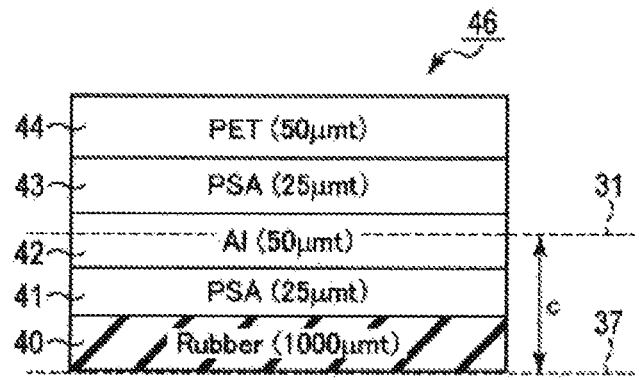
FIGS. 3(a), 3(b), and 3(c) are cross-sectional views illustrating specimens.
Figure 3B:
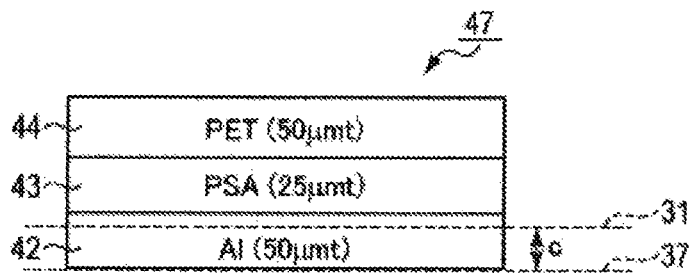
Figure 3C:
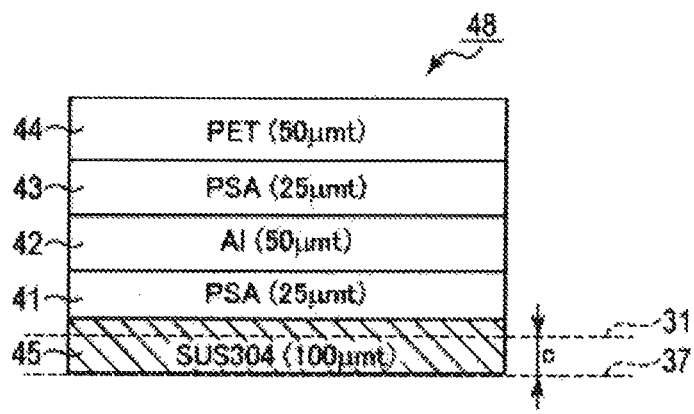

A evaluation result of the flexible display device 10 of this embodiment is explained with reference to FIGS. 3(a), 3(b), and 3(c). FIG. 3 is a cross-sectional view illustrating specimens. FIG. 3(a) shows a specimen 46 of a first embodiment, FIG. 3(b) shows a specimen 47 of a first comparative example, and FIG. 3(c) shows a specimen 48 of a second comparative example. In the first embodiment and the first and second examples, the specimens 46 to 48 each have a size as follows: a width is 100 mm and a length is 200 mm.

The specimen 46 of the first embodiment in FIG. 3(a) includes a structure that a rubber layer 40, a PSA layer 41, an aluminum layer 42, a PSA layer 43, and a PET layer 44 are sequentially stacked. This specimen 46 is fabricated as follows: laminating the PSA layer 43 on the PET layer 44, then laminating the aluminum layer 42, then laminating the PSA layer 41, and then laminating the rubber layer 40.

The specimen 47 of the first comparative example in FIG. 3(b) includes a structure that an aluminum layer 42, a PSA layer 43, and a PET layer 44 are sequentially stacked. This specimen 47 is fabricated as follows: laminating the PSA layer 43 on the PET layer 44, and then laminating the aluminum layer 42.

The specimen 48 of the second comparative example in FIG. 3(c) includes a structure that a stainless steel layer 45 (e.g., SUS 304), a PSA layer 41, an aluminum layer 42, a PSA layer 43, and a PET layer 44 are sequentially stacked. This specimen 48 is fabricated as follows: laminating the PSA layer 43 on the PET layer 44, then laminating the aluminum layer 42, then laminating the PSA layer 41, and then laminating the stainless steel layer 45.

The rubber layer 40 corresponds to the member 12 of FIG. 1. A material of the rubber layer 40 uses a silicon rubber. A thickness of the rubber layer 40 is 1000 um. An elastic modulus of the rubber layer 40 is about 70 MPa.

The PSA layer 41 corresponds to the adhesive layer 26 of FIG. 1.

The PSA layers 41 and 43 each use a double-sided adhesive sheet (Type No. ZB7011W) from DIC Corporation. The PSA layers 41 and 43 each have a thickness of 25 um. The PSA layers 41 and 43 each have an elastic modulus of 0.2 MPa.

The aluminum layer 42 serves as a component corresponding to the structure portion 18 of FIG. 1. The aluminum layer 42 uses an aluminum thin film from UACJ Corporation. The aluminum layer 42 has a thickness of 50 um. The aluminum layer 42 has an elastic modulus of 69 GPa.

The PET layer 44 corresponds to the substrate 13 of FIG. 1. The PET layer 44 uses a PET film (Type No. A4300) from TOYOBO Corporation. The PET layer 44 has a thickness of 50 um. The PET layer 44 has an elastic modulus of 5 GPa.

A material of the stainless steel layer 45 uses a stainless steel, SUS304 from Nippon Steel & Sumikin Stainless Steel Corporation. The stainless steel layer 45 has a thickness of 100 um. The stainless steel layer 45 has an elastic modulus of 193 GPa.

Regarding the specimen 47 of the first comparative example in FIG. 3(b), a distance c between a reference surface 37 and a neutral surface 31 is 30 um, and the neutral surface 31 is located inside the aluminum layer 42. Regarding the specimen 48 of the second comparative example in FIG. 3(c), a distance c between a reference surface 37 and a neutral surface 31 is 67 um, and the neutral surface 31 is located inside the stainless steel layer 45.

In comparison, regarding the specimen 46 of the first embodiment, a distance "c" between a reference surface 37 and a neutral surface 31 is 1054 um, and the neutral surface 31 is located inside the aluminum layer 42 corresponding to the structure portion 18 of FIG. 1.

Figure 4A:
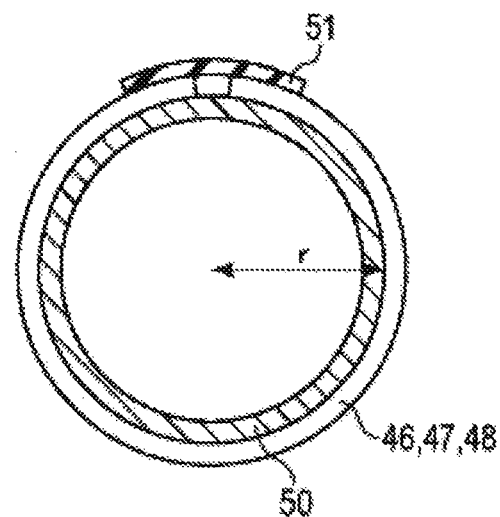
FIGS. 4(a) and 4(b) are views illustrating an evaluation method of a curvature amount.

FIG. 4(a) is a view illustrating an evaluation method of a curvature amount. An evaluation of a curvature amount ("a" of FIG. 4(b)) is conducted by winding each of specimens 46, 47 and 48 around a pipe 50 and heating it in an oven long time. FIG. 4(a) shows a state of winding each of the specimens 46, 47 and 48 around an outer circumference surface of the pipe 50. The specimens 46, 47 and 48 are wound around respective pipes 50. In a state that a center axis of the pipe 50 and a longer side of each of the specimens 46, 47 and 48 are parallel with each other, each of the specimens 46, 47 and 48 is wound around the corresponding pipe 50. Each of the specimens 46m 47 and 48 wound around the pipe 50 is fixed using a cellophane tape 51. A radius "r" of the pipe 50 is 30 mm. Each of the specimens 46, 47 and 48 wound around the pipe 50 enters an oven, and a heating treatment is conducted. A heating temperature is 60 degrees Celsius, and a heating time is 24 hours. After the heating treatment is finished, each of the specimens 46, 47 and 48 wound around the pipe 50 is taken out of the oven, then the cellophane tape 51 is stripped, then each of the specimens 46, 47 and 48 are removed from the pipe 50, and then a curvature amount a is measured.

Figure 4B:
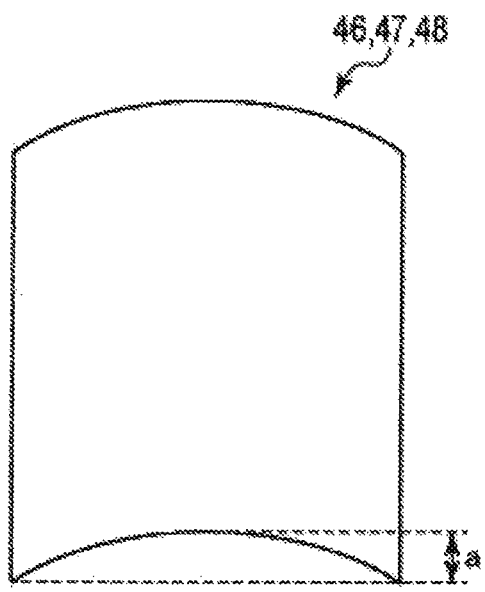

FIG. 4(b) is a perspective view illustrating a curvature amount "a." In the specimen 47 of the first comparative example, the curvature amount "a" is 72 mm. In this specimen 47, it is thought that occurrence of such the curvature amount is because a laminated portion of the PET layer 44, the PSA layer 43 and the aluminum layer 44 constituting the specimen 47 is modified but any component to restore this laminated portion from its modification.

In the second comparative example, a curvature amount "a" is 62 mm. When the stainless steel layer 45 is as a single body, an evaluated curvature amount "a" is 0 mm. A case of the stainless layer 45 as a signal body being with the curvature amount of 0 mm but a case of the second comparative example being with the curvature amount of 62 mm means that a cause of a modification of the second comparative example is a modification of a laminated portion of the PET layer 44, the PSA layer 43 and the aluminum layer 42. Further, it is thought that the stainless steel layer 45 does not have a force that fully restores the laminated portion of the PET layer 44, the PSA layer 43 and the aluminum layer 42 to an original state from its modification. It is thought that an effect, of restoring the laminated portion to an original state, being small by the stainless steel layer 45 is because the neutral surface 31 is located inside the stainless steel layer 45 and a moment of a force to return the modified laminated portion to an original state is small.

In the first embodiment, a curvature amount is 0 mm. It is though that this curvature moment of 0 mm is because the neutral surface 31 is located sufficiently away from the reference surface 37 and thus a moment of a force to return the laminated portion of the PET layer 44, the PSA layer 43 and the aluminum layer 42 to an original state from its modification is large.

According to this embodiment as above, the member formed of a material having a 3-dimensional cross-linked structure is located on a surface of the flexible display element 11. Therefore, even when keeping the flexible display device in a modified state or repeatedly modifying the device, the flexible display device can have a shape not set and be sufficiently returned to a flat state.

The present disclosure is not limited to the above-described embodiment and may be variously modified in other embodiments.

Figure 5:
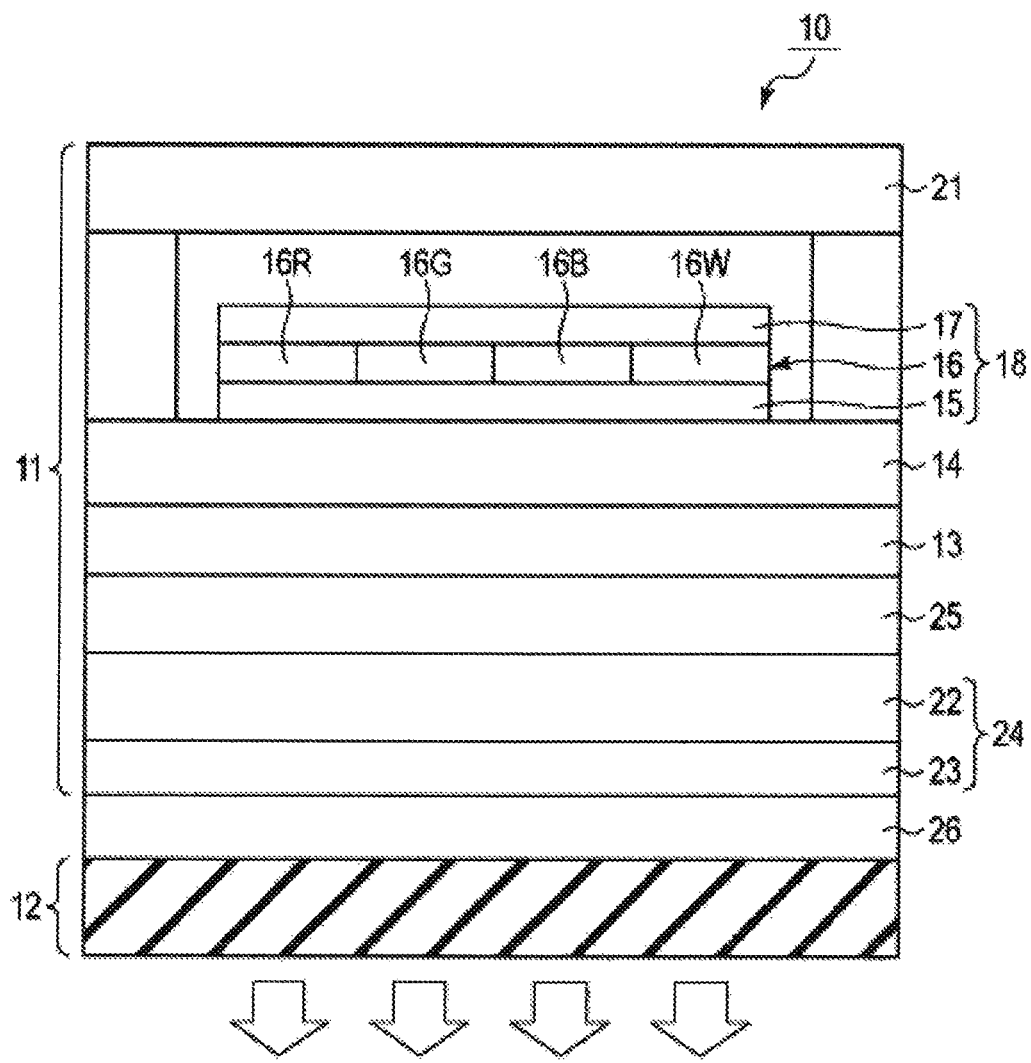
FIG. 5 is a cross-sectional view illustrating a flexible display device according to a modified embodiment of the present disclosure.

In the above embodiment, the member 12, which urges the flexible display device 10 to return from a modified shape to its original state, is located on a rear surface of the display element 11 by way of example, and not be way of limitation. In other embodiments, the member 12 may be located of another surface of the display element 11. For example, FIG. 5 is a cross-sectional view illustrating a flexible display device according to a modified embodiment of the present disclosure. Referring to FIG. 5, a member 12 serving to urge a modified flexible display device 10 to return to an original state is located on a front surface, i.e., a light emission surface, of a display element 11. In this case, the member 12 is needed to be light transparent. This member 12 may be, for example, silicon rubber, urethane rubber, or the like.

It will be apparent to those skilled in the art that various modifications and variations can be made in a display device of the present disclosure without departing from the sprit or scope of the disclosure. Thus, it is intended that the present disclosure covers the modifications and variations of this disclosure provided they come within the scope of the appended claims and their equivalents.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A flexible display device, comprising:
a display element that is flexible; and
a member that is located on a surface of the display element and is made of a material having a 3-dimensional cross-linked structure,
wherein the display element includes a substrate, a structure portion having an organic light emitting diode layer, an encapsulation layer on the structure portion to encapsulate the structure portion, a sealing portion surrounding, at a side peripheral region, the structure portion and the encapsulation layer, an upper surface of the encapsulation layer and an upper surface of the sealing portion being co-planar, and a metal layer on the encapsulation layer and the sealing portion.

2. The device of claim 1, wherein the member is attached on the surface of the display element by an adhesive layer.

3. The device of claim 2, wherein the adhesive layer is located entirely on the surface of the display element.

4. The device of claim 2, wherein the adhesive layer uses a pressure-sensitive adhesive.

5. The device of claim 1, wherein a glass transition temperature of the member is lower than a lowest limit of a preservation temperature range of the display element.

6. The device of claim 1, wherein the member includes a silicon rubber or urethane rubber.

7. The device of claim 1, wherein a neutral surface is a surface having zero distortion when the member is modified and the neutral surface is located outside the member.

8. The device of claim 7, wherein the display element includes a thin film transistor layer where a thin film transistor is formed, and
wherein the neutral surface is located at the thin film transistor layer or near the thin film transistor layer.

9. The device of claim 1, wherein the member is transparent and is located on a front surface of the display element.

10. The device of claim 1, wherein the member is located on a rear surface of the display element.

11. The device of claim 1, wherein an elastic modulus of the member is less than that of the display element, and a thickness of the member is greater than that of the display element.

12. The device of claim 1, wherein the display element is formed in a plate shape, and the member is formed in a plate shape.

13. A flexible display device, comprising:
a display element that is flexible, the display element having an elastic modulus that enables the display element to flex into a modified shape, the display element including,
a substrate;
a structure portion having an organic light emitting diode layer;
an encapsulation layer on the structure portion to encapsulate the structure portion; a sealing portion surrounding the structure portion and the encapsulation layer, at a side peripheral region, an upper surface of the encapsulation layer and an upper surface of the sealing portion being co-planar; and
a metal layer on the encapsulation and the sealing portion, and
a restore element that is located on a surface of the encapsulation layer, the restore element being made of a material having a 3-dimensional cross-linked structure, the restore element having a rigidity that urges the display element from the modified state back to the original shape.

14. The device of claim 13, wherein the restore member is attached on the surface of the metal layer by an adhesive layer that is located entirely on the surface of the display element.

15. The device of claim 14, wherein the adhesive layer uses a pressure-sensitive adhesive.

16. The device of claim 13, wherein a glass transition temperature of the restore member is lower than a lowest limit of a preservation temperature range of the display element.

17. The device of claim 13, wherein the restore member includes a silicon rubber or urethane rubber.

18. The device of claim 13, wherein a neutral surface is a surface having zero distortion when the restore member is modified and the neutral surface is located outside the restore member.

19. The device of claim 18, wherein the display element includes a thin film transistor layer where a thin film transistor is formed, and wherein the neutral surface is located at the thin film transistor layer or near the thin film transistor layer.

20. The device of claim 13, wherein the original shape of the display element is flat and the modified shape of the display element is curved.

* * * * *